(12) United States Patent
Nozaki

(10) Patent No.: US 6,459,399 B1
(45) Date of Patent: Oct. 1, 2002

(54) A/D CONVERTER CIRCUIT

(75) Inventor: Hirohide Nozaki, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/799,079

(22) Filed: Mar. 6, 2001

(30) Foreign Application Priority Data

Oct. 5, 2000 (JP) ........................................ 2000-305697

(51) Int. Cl.[7] .............................................. H03M 1/10
(52) U.S. Cl. ........................................ 341/155; 341/158
(58) Field of Search ................................. 341/155, 156, 341/158, 159

(56) References Cited

U.S. PATENT DOCUMENTS

| | | | | |
|---|---|---|---|---|
| 4,893,124 A | * | 1/1990 | Tsuji ........................... | 341/156 |
| 6,281,831 B1 | * | 8/2001 | Shou et al. ................... | 341/159 |

FOREIGN PATENT DOCUMENTS

| | | | |
|---|---|---|---|
| JP | 3-175718 | 7/1991 | |
| JP | 10-322210 | * 12/1998 | ............ H03M/1/34 |

* cited by examiner

Primary Examiner—Howard L. Williams
(74) Attorney, Agent, or Firm—Leydig Voit & Mayer, Ltd.

(57) ABSTRACT

An analog-to-digital (A/D) converter circuit has comparators, each of which receives an input analog signal and a respective reference voltage and generates and outputs a digital signal based on comparison of the input analog signal to the respective reference voltage. A switch supplies a high-level reference voltage to the comparators when performing A/D conversion and supplies a high-level voltage to the comparators when not performing an A/D conversion. Another switch supplies a low-level reference voltage to the comparators when performing an A/D conversion and supplies the high-level voltage to the comparators when not performing an A/D conversion. Still another switch supplies the input analog signal to the comparators when performing an A/D conversion and supplies a low-level voltage to the comparators when not performing an A/D conversion.

6 Claims, 7 Drawing Sheets

A/D CONVERTER CIRCUIT

FIELD OF THE INVENTION

The present invention in general relates to a chopper-type A/D converter circuit. More particularly, this invention relates to an A/D converter circuit capable of reducing power consumption by cutting off a through current of inverter circuits within comparators during a halt period of an A/D (analog to digital) conversion operation. In other words, the invention relates to an A/D converter circuit capable of setting an inverter circuit to a power-saving mode.

BACKGROUND OF THE INVENTION

FIG. 7 shows a structure of a conventional A/D converter circuit. This conventional A/D converter circuit 21 comprises a plurality of comparators 22-1 to 22-M (where M represents a number of bits of a digital output of the A/D converter circuit 21) each for comparing an input analog signal (an input voltage) input to the A/D converter circuit 21 from the outside with a predetermined reference voltage (a comparison voltage) by inputting the signal and the voltage into the comparator and for outputting a digital signal. Further, a ladder resistor circuit 23 is provided. This ladder resistor circuit 23 has a plurality of resistors 23-1 to 23-(M+1) connected in series and having comparison-voltage input terminals (terminals for inputting a comparison voltage) of the comparators 22-1 to 22-M connected to between these resistors. Further, a buffer circuit 24 having one end of the ladder resistor circuit 23 connected to an output terminal of the buffer circuit 24, a buffer circuit 25 having the other end of the ladder resistor circuit 23 connected to an output terminal of the buffer circuit 25, and a buffer circuit 26 having input-voltage input terminals (terminals for inputting input voltages) of the plurality of comparators 22-1 to 22-M connected to an output terminal of the buffer circuit 26, are provided.

FIG. 8 shows a detail structure of any comparator of the comparators shown in FIG. 7. A comparator 22-$m$ (which may be any comparator out of the comparators 22-1 to 22-M) comprises a switch 31 having an input-voltage input terminal connected to one end of the switch 31, a switch 32 having a comparison-voltage input terminal connected to one end of the switch 32; a capacitor 33 having the other end of the switch 31 and the other end of the switch 32 connected to one end of the capacitor 33; an inverter circuit 34 having the other end of the capacitor 33 connected to an input terminal of the inverter circuit 34; and a switch 35 connected to between the input terminal of the inverter circuit 34 and an output terminal of the inverter circuit 34.

FIG. 9A and FIG. 9B are diagrams for explaining the operation of the conventional comparator 22-$m$. Furthermore, FIG. 10 is a waveform diagram showing the operation of the conventional comparator 22-$m$. The comparator 22-$m$ repeats a state that the switches 31 and 35 are closed and the switch 32 is opened (refer to FIG. 9A) and a state that the switches 31 and 35 are opened and the switch 32 is closed (refer to FIG. 9B), in synchronism with a clock signal input to the A/D converter circuit 21 from the outside. When the switch 31 is closed and the switch 32 is opened, an input voltage is applied to the input side (the side of the switches 31 and 32) of the capacitor 33. Then the voltage at the input side of the capacitor 33 becomes the input voltage having a voltage value Vin2.

When the switch 35 is closed, the input terminal of the inverter circuit 34 and the output terminal of the inverter circuit 34 are short-circuited. As a result, a threshold voltage Vth2 of the inverter circuit 34 is generated at the input terminal and the output terminal of the inverter circuit 34. In other words, a voltage at the output side (the inverter circuit 34 side) of the capacitor 33 and a voltage at the output side of the inverter circuit 34 become the threshold voltage Vth2. Thus, a charge of a potential difference between the voltage Vin2 of the input voltage and the threshold voltage Vth2 is accumulated in the capacitor 33. On the other hand, when the switch 31 is opened and the switch 32 is closed, a comparison voltage is applied to the input side of the capacitor 33. Then, the voltage at the input side of the capacitor 33 becomes the comparison voltage having a voltage value Vcomp2.

Further, when the switch 31 is opened and the switch 32 is closed, with the switch 35 opened, then the voltage at the output side of the capacitor 33 shifts by a change in the voltage at the input side of the capacitor 33, "Vcomp2—Vin2". In other words, the voltage at the output side of the capacitor 33 becomes "Vth2+(Vcomp2—Vin2)". The voltage at the output side of the inverter circuit 34 becomes "Vth2+α2". In this case, α2 is a product obtained by multiplying an amplification factor of the inverter circuit 34 to "Vcomp2—Vin2" that is the potential difference between the voltage at the output side of the capacitor 33 and the threshold voltage Vth2. An A/D conversion is executed based on the operation of each of the comparators 22-1 to 22-M in a similar manner.

When the switches 31 and 35 are closed and the switch 32 is opened, the voltage at the output side of the capacitor 33 becomes the threshold voltage Vth2, and a through current flows to a transistor (not shown) inside the inverter circuit 34. When the switches 31 and 35 are opened and the switch 32 is closed, the voltage at the output side of the capacitor 33 becomes close to the threshold voltage Vth2 when "Vcomp2–Vin2" is not sufficiently large. Thus, the voltage at the output side of the inverter circuit 34 does not coincide with a high-potential side voltage VDD2 of a power source or a low-potential side voltage GND2 of the power source. Then, a through current flows to the transistor (not shown) within the inverter circuit 34. In actual practice, "Vcomp2–Vin2" is not sufficiently large in most of the cases, and a through current flows as a result.

In other words, a through current flows in both the state that the switches 31 and 35 are closed and the switch 32 is opened and the state that the switches 31 and 35 are opened and the switch 32 is closed. The through current flows continuously even during a period while the clock signal has been stopped and the A/D conversion of the A/D converter circuit 21 has been in the halt. Therefore, there is an inconvenience that the power consumption of the A/D converter circuit 21 increases. FIG. 11 is a diagram showing another conventional structure of a comparator for solving the above problem.

This comparator has a switch 40 provided between the output side of the capacitor 33 and a low-potential level side of a power source in the comparator 22-$m$ shown in FIG. 8. An A/D converter circuit using this comparator keeps the switch 40 open during an A/D conversion operation. For stopping the A/D conversion, the switch 40 is closed. Thus, the voltage at the output side of the capacitor 33 becomes a low-potential side voltage GND2 of the power source, and the through current of the inverter circuit 34 is cut off. Therefore, it is possible to realize a power-saving mode for reducing power consumption.

According to the above-described conventional technique, however, the switch 40 for the power-saving mode is added to the capacitor 33 within the comparator that substantially affects the precision of the A/D converter circuit. Therefore, there has been a problem that the potential of the comparator varies and the precision of the A/D converter circuit is degraded.

SUMMARY OF THE INVENTION

It is an object of the present invention to provide an A/D converter circuit capable of improving the precision of the A/D converter circuit while reducing power consumption.

The A/D converter circuit according to one aspect of the present invention comprises a switch unit which receives the input analog signal, a reference voltage, a first voltage, and a second voltage which is lower than the first voltage; and a comparator unit which receives the input analog signal and the reference voltage from the switch unit, compares the input analog signal and the reference voltage, and outputs the digital signal based on the result of the comparison between the input analog signal and the reference voltage. The switch unit outputs the input analog signal and the reference voltage to the comparator unit when the comparator is required to perform the A/D conversion of the input analog signal, and outputs the first voltage and the second voltage to the comparator unit when the comparator is required to perform the A/D conversion of the input analog signal.

According to the above invention, when performing the A/D conversion, the comparator unit receives the input analog signal and the reference voltage, performs a comparison between the input analog signal and the reference voltage, and generates and outputs a digital signal based on the comparison between the input analog signal and the reference voltage. On the other hand, when not performing the A/D conversion, the comparator unit does not receive the input analog signal and the reference voltage, instead receives the first and second voltages. Because of such an arrangement, it is possible to change over between the reference voltage and the input analog signal and the first voltage and the second voltage, while restricting an influence on the precision due to the provision of the switches.

Further, it is preferable that the first voltage is a high-potential side voltage of a power source or a low-potential side voltage of the power source, and the second voltage is a low-potential side voltage of the power source or a high-potential side voltage of the power source. Accordingly, it is possible to obtain the first voltage and the second voltage easily and securely for preventing the through current of the inverter circuits within the comparators.

Further, it is preferable that a safety unit, for stabilizing the input analog signal and the reference voltage, is disposed at a post-stage of the switches. Accordingly, it is possible to further restrict an influence on the precision due to the provision of the switches.

The A/D converter circuit according to one aspect of the present invention comprises a first switch having two input terminals and one output terminal, the first switch receiving a high-potential voltage from one of the two input terminals and receiving a first reference voltage from the other one of the two input terminals; a first buffer circuit having an input terminal and an output terminal, the input terminal being connected to the output terminal of the first switch; a second switch having two input terminals and one output terminal, the second switch receiving a high-potential voltage from one of the two input terminals and receiving a second reference voltage from the other on of the two input terminals; a second buffer circuit having an input terminal and an output terminal, the input terminal being connected to the output terminal of the second switch; a third switch having two input terminals and one output terminal, the second switch receiving an input analog signal from one of the two input terminals and receiving a low-potential voltage from the other one of the two input terminals; a third buffer circuit having an input terminal and an output terminal, the input terminal being connected to the output terminal of the third switch; a resistor circuit having N number of resistors connected in series, the resistor circuit having two input terminals and a node between adjacent resistors functioning as an output terminal thereby having N−1 number of output terminals, one of the two input terminals of the resistor circuit being connected to the output terminal of the first buffer circuit, the other one of the two input terminals of the resistor circuit being connected to the output terminal of the second buffer circuit; and N—1 number of comparators each having two input terminals and one output terminal, one of the two input terminals of each comparator being connected to the output terminal between respective adjacent resistors of the resistor circuit, the other one of the two input terminals of each comparator being connected to the output terminal of the third buffer. When performing A/D conversion, the first switch allows the first reference voltage to be output through its output terminal to the first buffer circuit, the second switch allows the second reference voltage to be output through its output terminal to the second buffer circuit, and the third switch allows the input analog signal to be output through its output terminal to the third buffer circuit, the resistor circuit outputs a reference voltage from each one of its N−1 number of output terminals, and each one of the comparators generates a digital signal based on a result of comparison between the reference voltage and the input analog signal. When not performing the A/D conversion, the first switch allows the high-potential voltage to be output through its output terminal to the first buffer circuit, the second switch also allows the high-potential voltage to be output through its output terminal to the second buffer circuit, and the third switch allows the low-potential voltage to be output through its output terminal to the third buffer circuit.

According to the above invention, when performing A/D conversion, the first switch allows the first reference voltage to be output through its output terminal to the first buffer circuit, the second switch allows the second reference voltage to be output through its output terminal to the second buffer circuit, and the third switch allows the input analog signal to be output through its output terminal to the third buffer circuit, the resistor circuit outputs a reference voltage from each one of its N−1 number of output terminals, and each one of the comparators generates a digital signal based on a result of comparison between the reference voltage and the input analog signal. On the other hand, when not performing the A/D conversion, the first switch allows the high-potential voltage to be output through its output terminal to the first buffer circuit, the second switch also allows the high-potential voltage to be output through its output terminal to the second buffer circuit, and the third switch allows the low-potential voltage to be output through its output terminal to the third buffer circuit. Based on the above arrangement, it is possible to switch over between the reference voltage and the input analog signal and the high-potential side voltage of the power source and the low-potential side voltage of the power source (or the low-potential side voltage of the power source and the high-potential side voltage of the power source), while restricting an influence on the precision due to the provision of the first switch, the second switch and the third switch.

Other objects and features of this invention will become apparent from the following description with reference to the accompanying drawings.

DESCRIPTION OF THE PREFERRED EMBODIMENTS

A preferred embodiment of the present invention will be explained in detail below with reference to the drawings. It should be noted that the present invention is not limited by the embodiment.

Figure 1:
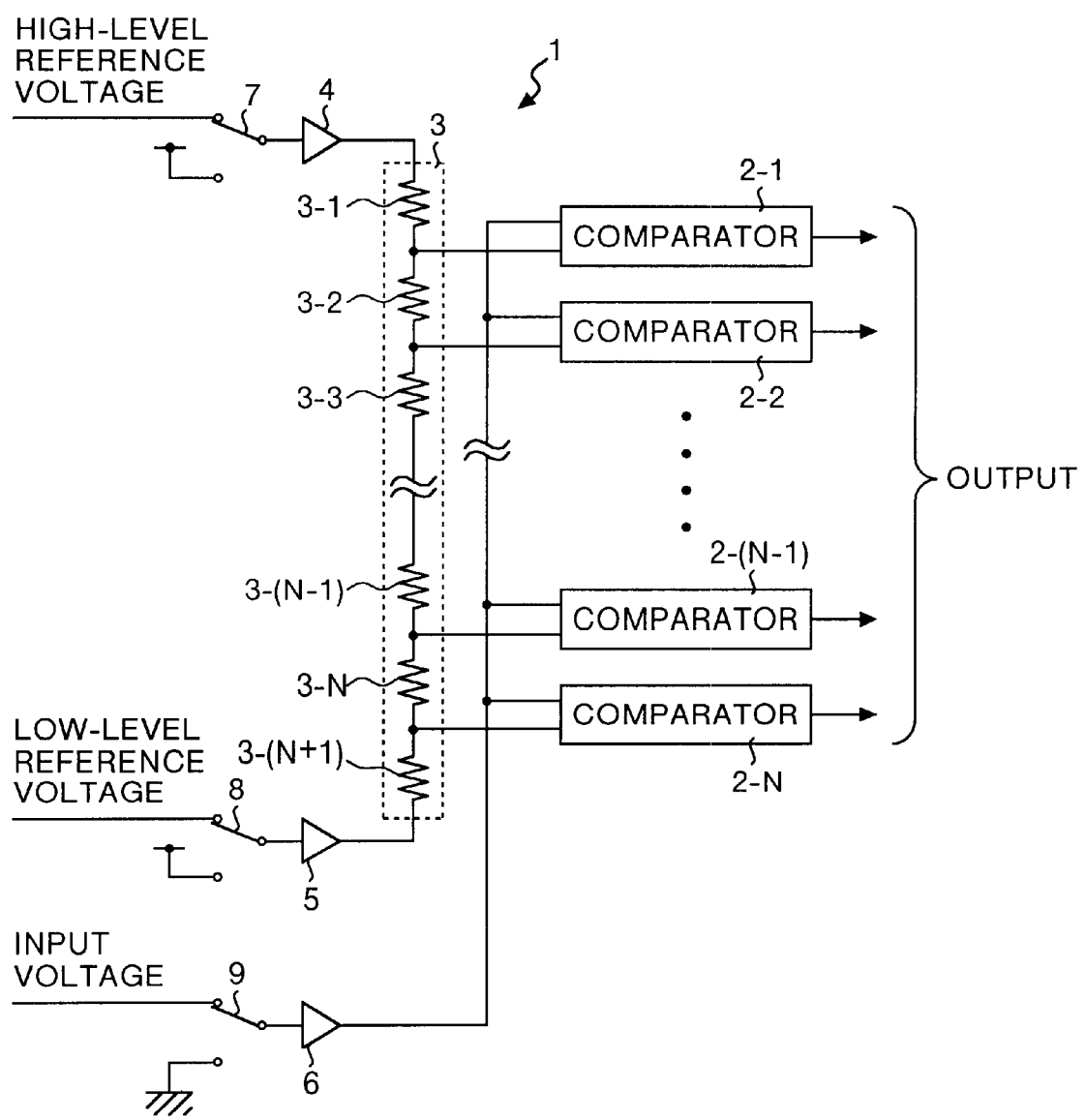
FIG. 1 is a diagram showing a structure of an A/D converter circuit relating to one embodiment of the present invention.

FIG. 1 is a diagram showing a structure of an A/D converter circuit relating to one embodiment of the present invention. The A/D converter circuit 1 comprises a plurality of comparators 2-1 to 2-N (where N represents a number of bits of a digital output of the A/D converter circuit 1) each for comparing an input analog signal (an input voltage) input to the A/D converter circuit 1 from the outside with a predetermined reference voltage (a comparison voltage) by inputting the signal and the voltage into the comparator and for outputting a digital signal; a ladder resistor circuit 3 having a plurality of resistors 3-1 to 3-(N+1) connected in series and having comparison-voltage input terminals (terminals for inputting a comparison voltage) of the comparators 2-1 to 2-N connected to between these resistors; a buffer circuit 4 having one end of the ladder resistor circuit 3 connected to an output terminal of the buffer circuit 4; a buffer circuit 5 having the other end of the ladder resistor circuit 3 connected to an output terminal of the buffer circuit 5; a buffer circuit 6 having input-voltage input terminals (terminals for inputting input voltages) of the plurality of comparators 2-1 to 2-N connected to an output terminal of the buffer circuit 6; a switch 7 for selecting one of a high potential side of the power source voltage and a signal line for supplying a high-level reference voltage for generating a comparison voltage, and connecting the selected one to an input terminal of the buffer circuit 4; a switch 8 for selecting one of a high potential side of the power source voltage and a signal line for supplying a low-level reference voltage for generating a comparison voltage, and connecting the selected one to an input terminal of the buffer circuit 5; and a switch 9 for selecting one of a low potential side voltage of the power source and the input voltage, and connecting the selected one to an input terminal of the buffer circuit 6.

During an A/D conversion operation, the switch 7 maintains the connection between the high-level reference voltage side and the input terminal of the buffer circuit 4. At least one clock before the A/D conversion operation is stopped, the switch 7 connects the high potential side of the power source to the input terminal of the buffer circuit 4 by changing over from the high-level reference voltage side. During an A/D conversion operation, the switch 8 maintains the connection between the low-level reference voltage side and the input terminal of the buffer circuit 5. At least one clock before the A/D conversion operation is stopped, the switch 8 connects the high potential side of the power source to the input terminal of the buffer circuit 5 by changing over from the low-level reference voltage side. In this case, the high-level reference voltage and the low-level reference voltage refer to the voltages that are used for generating a comparison voltage to each of the comparators 2-1 to 2-N. The voltage range from the high-level reference voltage to the low-level reference voltage becomes a permissible range of an input analog voltage.

During an A/D conversion operation, the switch 9 maintains the connection between the input voltage side and the input terminal of the buffer circuit 6. At least one clock before the A/D conversion operation is stopped, the switch 9 connects the low potential side of the power source to the input terminal of the buffer circuit 6 by changing over from the input voltage input terminal. The buffer circuits 4 to 6 have low output impedance, and stabilize the signals (voltages) to the comparators 2-1 to 2-N. The ladder resistor circuit 3 divides the voltage range from the output voltage of the buffer circuit 4 to the output voltage of the buffer circuit 5 into a plurality of stages, and outputs the divided voltages to the comparison voltage input terminals of the comparators 2-1 to 2-N.

Figure 2:
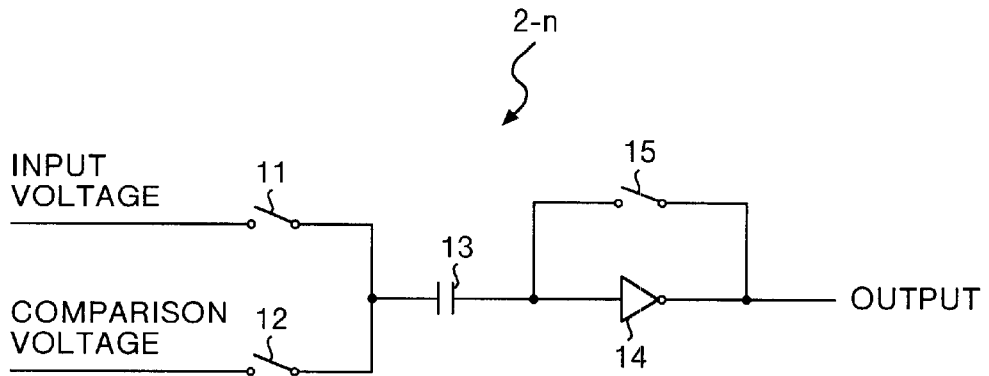
FIG. 2 is a diagram showing a structure of a comparator shown in FIG. 1.

FIG. 2 is a diagram showing a structure of each comparator shown in FIG. 1. All of the comparators 2-1 to 2-N shown in FIG. 1 have the same structures. An optional comparator 2-n among the comparators 2-1 to 2-N consists of: a switch 11 having an input-voltage input terminal connected to one end of the switch 11; a switch 12 having a comparison-voltage input terminal connected to one end of the switch 12; a capacitor 13 having the other end of the switch 11 and the other end of the switch 12 connected to one end of the capacitor 13; an inverter circuit 14 having the other end of the capacitor 13 connected to an input terminal of the inverter circuit 14; and a switch 15 connected to between the input terminal of the inverter circuit 14 and an output terminal of the inverter circuit 14. The capacitor 13 stores the charge, and the inverter circuit 14 inversely amplifies the signal and outputs the inverted signal.

An output of the inverter circuit of each of the comparators 2-1 to 2-N becomes an output digital signal of the A/D converter circuit 1. Each of the switches 7 to 9, 11, 12 and 15 is turned on/off by the control of a control circuit not shown within the A/D converter circuit 1 or by the control of a control circuit not shown outside the A/D converter circuit 1. In the A/D converter circuit 1, the high potential side of the power source may be replaced with the low potential side of the power source. In place of the high potential side of the power source and the low potential side of the power source, there may be used two voltages having a potential difference of a predetermined value or above that is sufficient enough to prevent a through current in the inverter circuit within each of the comparators 2-1 to 2-N.

Figure 3A:
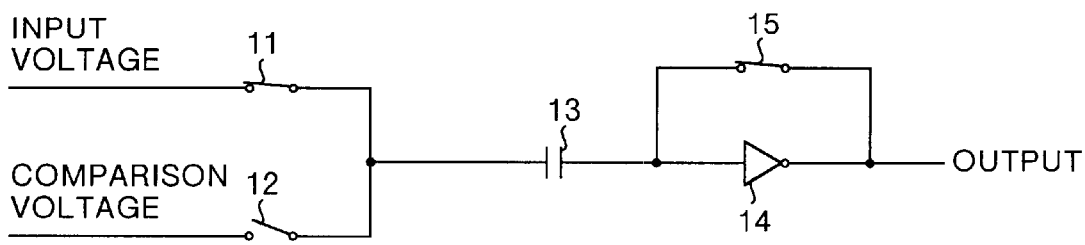
FIG. 3A and FIG. 3B are diagrams for explaining the operation of the comparator relating to the embodiment.
Figure 3B:
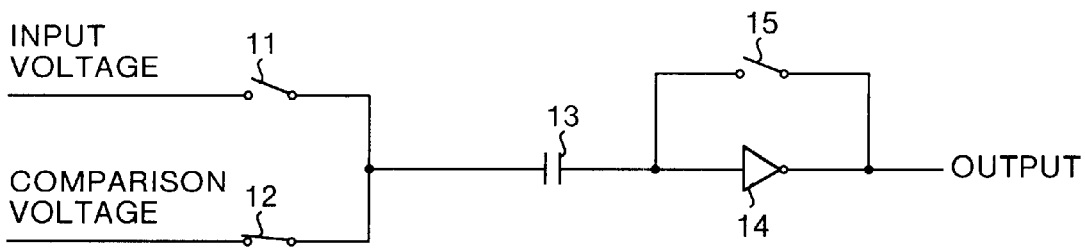
Figure 4:
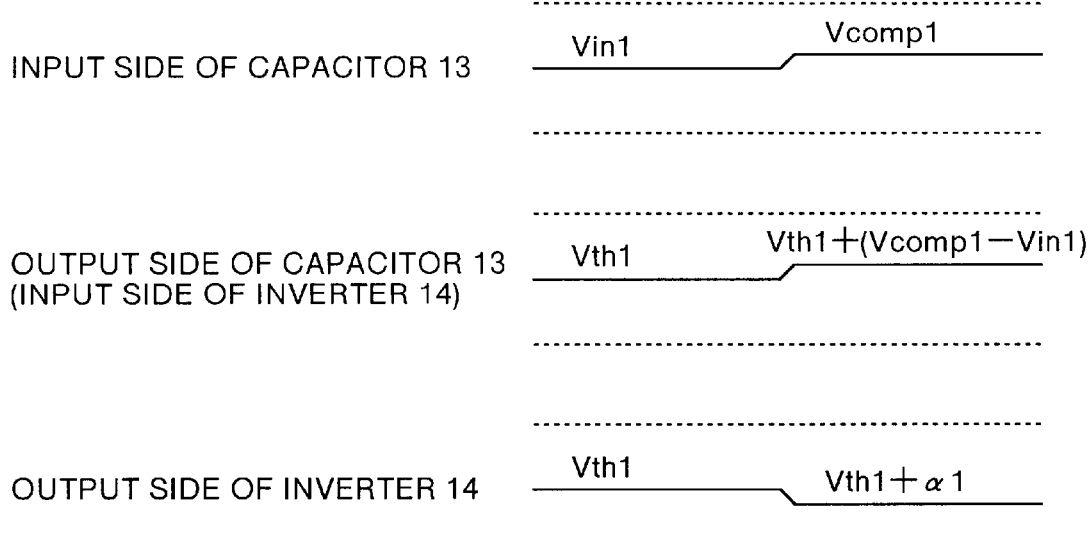
FIG. 4 is a waveform diagram showing the operation of the comparator during an A/D conversion operation relating to the embodiment.

The operation of the present embodiment having the above structure will be explained with reference to FIG. 3A to FIG. 5. FIG. 3A and FIG. 3B are diagrams for explaining the operation of a comparator 2-$n$ relating to the embodiment. Furthermore, FIG. 4 is a waveform diagram showing the operation of the comparator 2-$n$ during an A/D conversion operation relating to the embodiment. The comparator 2-$n$ repeats a state that the switches 11 and 15 are closed and the switch 12 is opened (refer to FIG. 3A) and a state that the switches 11 and 15 are opened and the switch 12 is closed (refer to FIG. 3B), in synchronism with a clock signal input to the A/D converter circuit 1 from the outside. Consider a case in which the switch 11 is closed and the switch 12 is opened. In such a case, an input voltage is applied to the input side (the side of the switches 11 and 12) of the capacitor 13. Then the voltage at the input side of the capacitor 13 becomes the input voltage having a voltage value Vin1.

Further, consider a case in which the switch 11 is closed and the switch 12 is opened and the switch 15 is closed. In such a case, the input terminal of the inverter circuit 14 and the output terminal of the inverter circuit 14 are short-circuited. As a result, a threshold voltage Vth1 of the inverter circuit 14 is generated at the input terminal and the output terminal of the inverter circuit 14. In other words, a voltage at the output side (the inverter circuit 14 side) of the capacitor 13 and a voltage at the output side of the inverter circuit 14 become the threshold voltage Vth1. Thus, a charge of a potential difference between the voltage Vin1 of the input voltage and the threshold voltage Vth1 is accumulated in the capacitor 13. Now, consider a case in which the switch 11 is opened and the switch 12 is closed. In such a case, a comparison voltage is applied to the input side of the capacitor 13. Then, the voltage at the input side of the capacitor 13 becomes the comparison voltage having a voltage value Vcomp1.

Further, consider a case in which the switch 11 is opened and the switch 12 is closed and the switch 15 is opened. In such a case, then the voltage at the output side of the capacitor 13 shifts by a change in the voltage at the input side of the capacitor 13, "Vcomp1—Vin1". In other words, the voltage at the output side of the capacitor 13 becomes "Vth1+(Vcomp1—Vin1)". The voltage at the output side of the inverter circuit 14 becomes "Vth1+α1". In this case, α1 is a product obtained by multiplying an amplification factor of the inverter circuit 14 to "Vcomp1—Vin1" that is the potential difference between the voltage at the output side of the capacitor 13 and the threshold voltage Vth1. An A/D conversion is executed based on the operation of each of the comparators 2-1 to 2-N in a similar manner.

Figure 5:
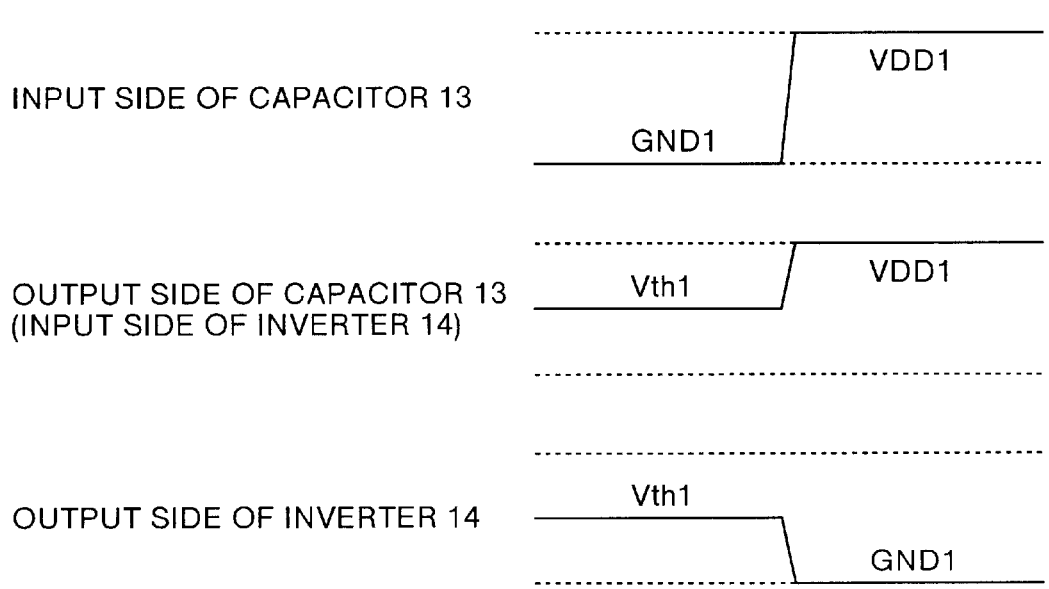
FIG. 5 is a waveform diagram showing the operation of the comparator when an A/D conversion operation is stopped relating to the embodiment.

Next, the operation of shifting to a power-saving mode by stopping the A/D conversion will be explained. FIG. 5 is a waveform diagram showing the operation of the comparator 2-$n$ when the A/D conversion operation is stopped relating to the present embodiment. For stopping the A/D conversion operation, the switches 7 to 9 are changed over at least one clock before the A/D conversion is stopped. Thus, a low-potential side voltage GND1 of the power source is applied to the input-voltage input terminal of the comparator 2-$n$ via the switch 9 and the buffer circuit 6. Further, a high-potential side voltage VDD1 of the power source is applied to both ends of the ladder resistor circuit 3 via the switches 7 and 8 and the buffer circuits 4 and 5. Therefore, a voltage substantially equivalent to the high-potential side voltage VDD1 of the power source is applied to the comparison-voltage input terminal of the comparator 2-$n$.

The comparator 2-$n$ first closes the switches 11 and 15, and opens the switch 12. Then, the input side of the capacitor 13 is connected to the input-voltage input terminal to have the voltage GND1. The voltage at the output side of the capacitor 13 and the voltage at the output side of the inverter circuit 14 become the threshold voltage Vth1. Next, the switches 11 and 15 are opened, and the switch 12 is closed. Then, the input side of the capacitor 13 is connected to the comparison-voltage input terminal to have the voltage VDD1. As the voltage at the input side of the capacitor 13 changes sufficiently large from GND1 to VDD1, the voltage at the output side of the capacitor 13 becomes VDD1, and the voltage at the output side of the inverter circuit 14 becomes GND1.

Figure 6:
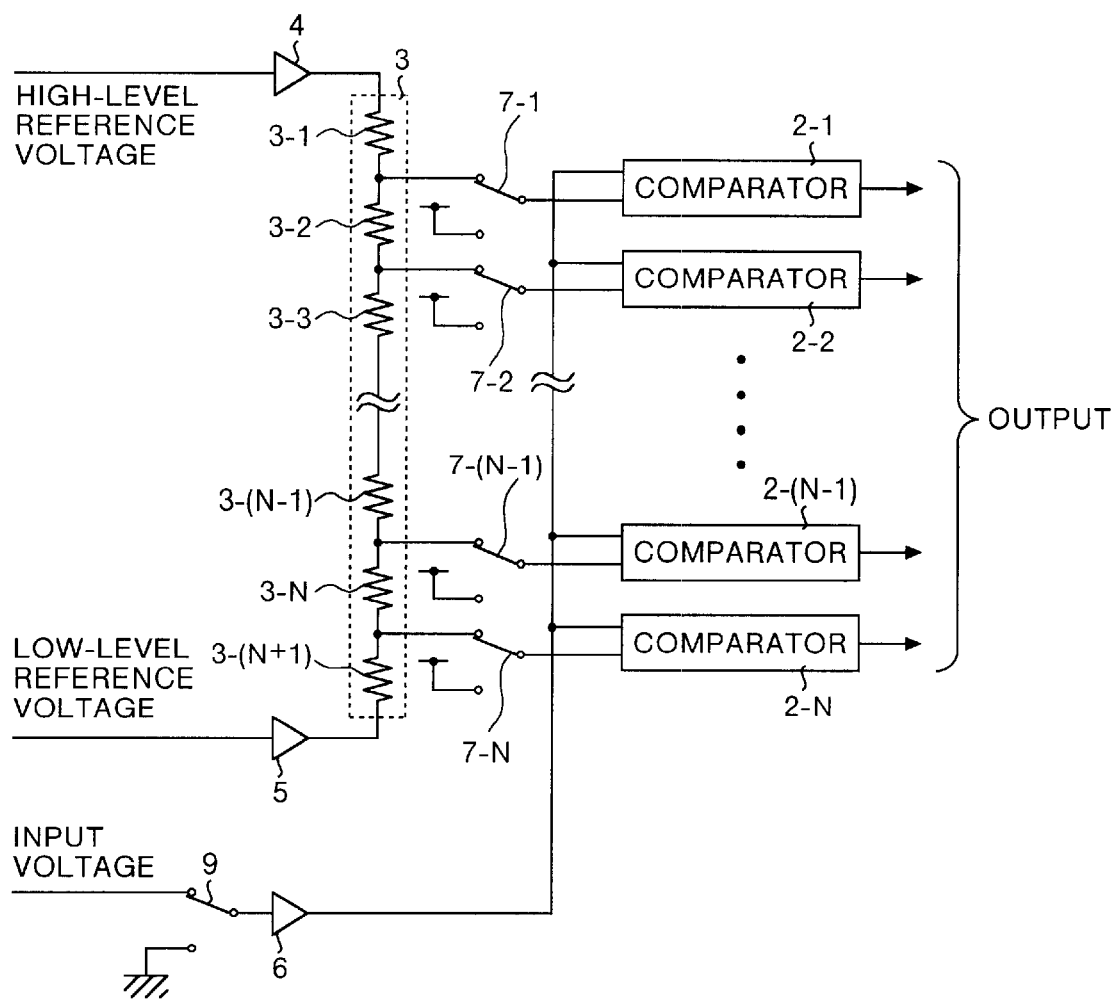
FIG. 6 is a diagram showing another structure of an A/D converter circuit relating to the embodiment of the invention.
Figure 7:
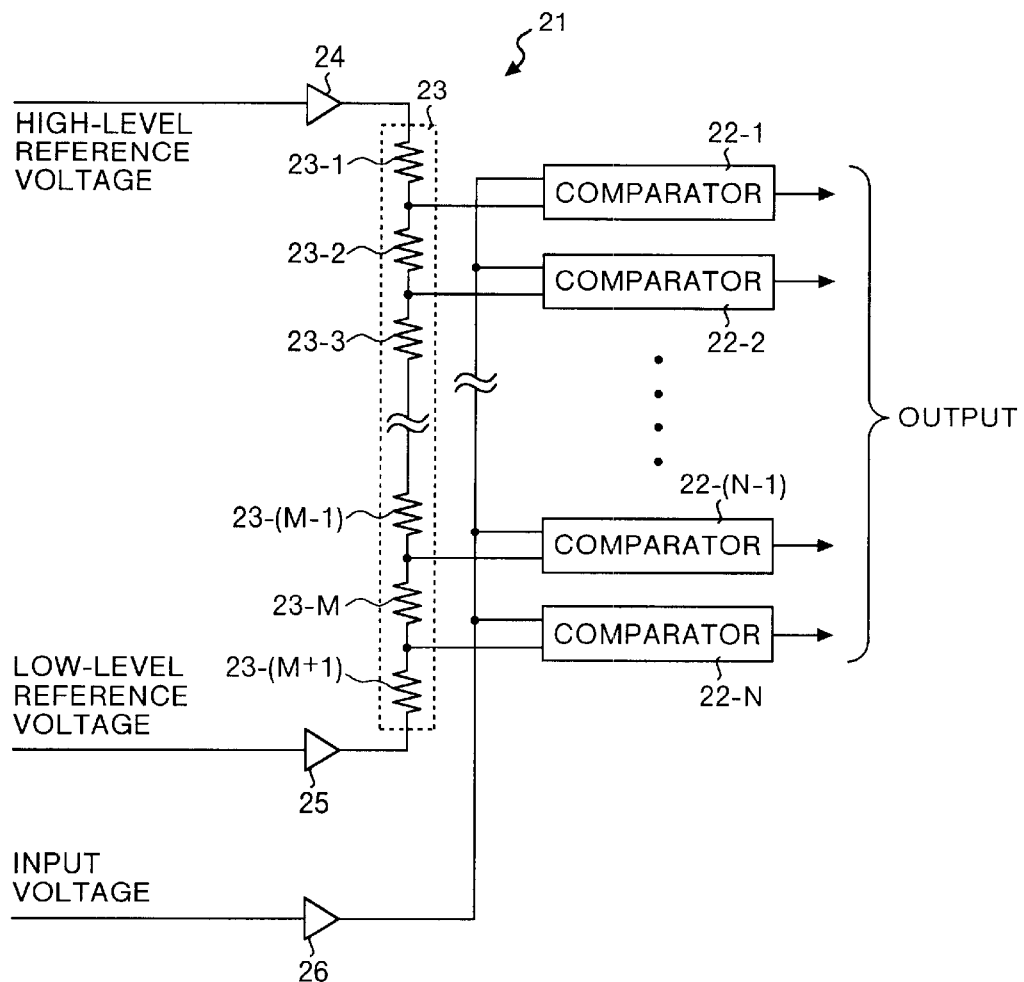
FIG. 7 is a diagram showing a structure of a conventional A/D converter circuit.
Figure 8:
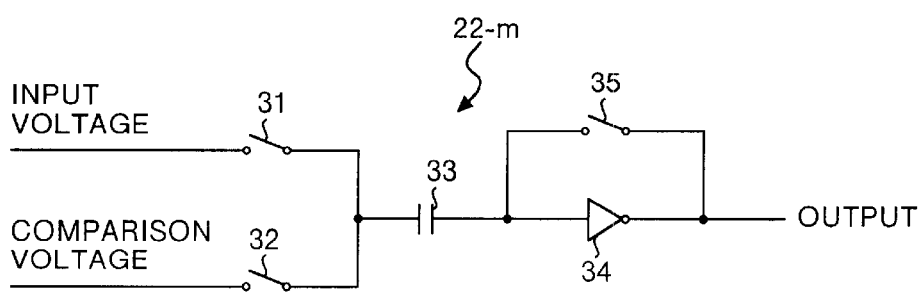
FIG. 8 is a diagram showing a structure of a comparator shown in FIG. 7.
Figure 9A:
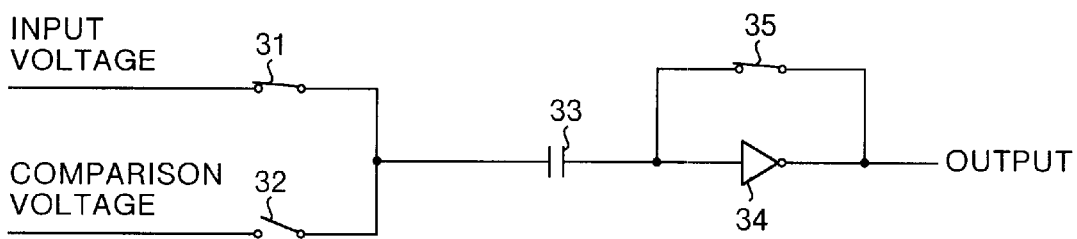
FIG. 9A and FIG. 9B are diagrams for explaining the operation of the conventional comparator.
Figure 9B:
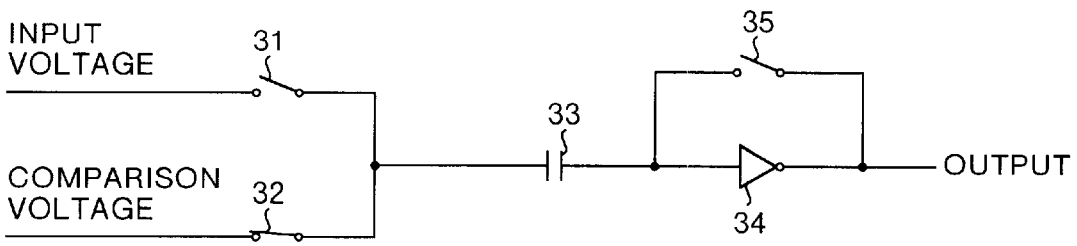
Figure 10:
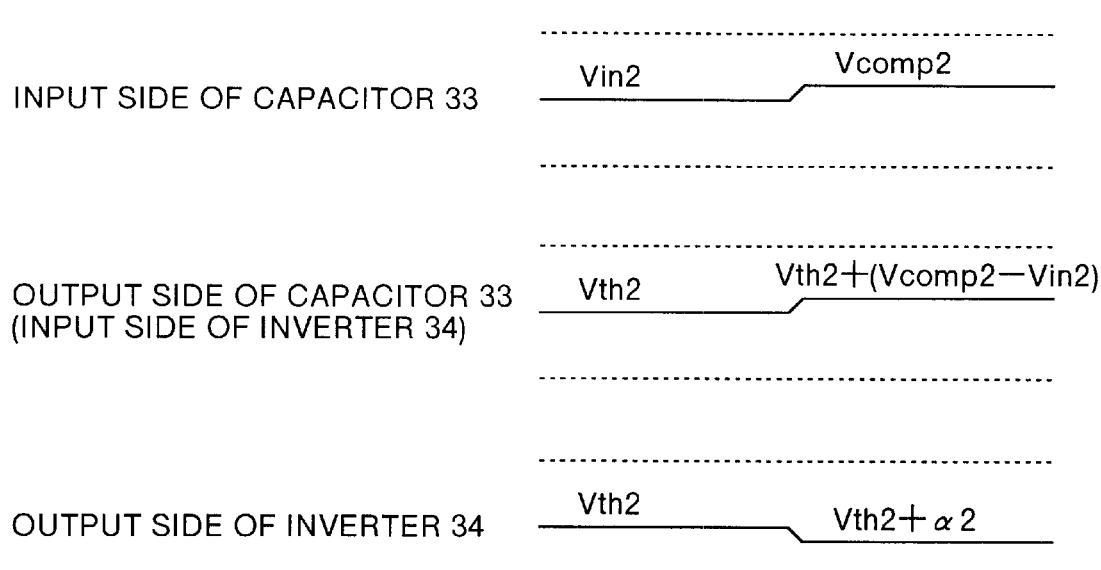
FIG. 10 is a waveform diagram showing the operation of the conventional comparator.
Figure 11:
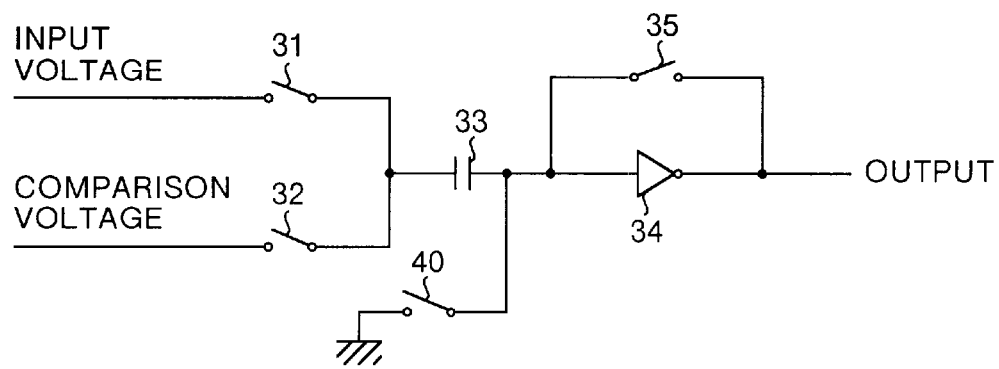
FIG. 11 is a diagram showing another conventional structure of a comparator.

In a state that the voltage at the output side of the inverter circuit 14 is GND1, only an N-channel transistor not shown within the inverter circuit 14 is turned on. Therefore, there is no through current flowing. All the comparators 2-1 to 2-N become in this state. When the clock signal is stopped in this state, the A/D converter circuit 1 can be set to a power-saving mode. In place of the high-potential side voltage of the power source and the low-potential side voltage of the power source, there may be used a pair of voltages having a potential difference of a predetermined value or above that can set the output voltage of the inverter circuit 14 to GND1 or VDD1. Further, as shown in FIG. 6, in place of the switches 7 and 8, there may be provided switches 7-1 to 7-N for the power-saving mode between the comparators 2-1 to 2-N and the ladder resistor circuit 3. During the A/D conversion operation, the switches 7-1 to 7-N keep connecting the comparators 2-1 to 2-N with the ladder resistor circuit 3. For halting the A/D conversion operation, the switches 7-1 to 7-N connect the high potential side of the power source (or the low potential side of the power source) with the comparators 2-1 to 2-N.

As described above, according to the present embodiment, each of the comparators 2-1 to 2-N inputs an input voltage and a comparison voltage and compares between these voltages. Each of the switches 7 to 9 provided at the outside of the comparators 2-1 to 2-N selects one of the combination of the comparison voltage and the input voltage and the combination of the high-potential side voltage of the power source and the low-potential side voltage of the power source, and inputs the selected combination to the corresponding one of the comparators 2-1 to 2-N, by changing over between the combinations. Based on the above arrangement, it is possible to switch over between the combination of the comparison voltage and the input voltage and the combination of the high-potential side voltage of the power source and the low-potential side voltage of the power source, while restricting an influence on the precision due to the provision of the switches 7 to 9. Therefore, it is possible to improve the precision while reducing power consumption.

As explained above, according to the present invention, each comparator inputs an input analog signal from the outside and a predetermined reference voltage, and compares between the input analog signal and the reference voltage. The switches provided at the outside of the comparators changes over between the combination of the reference voltage and the input analog signal and the combination of a first voltage and a second voltage having a potential difference of a predetermined value or above from the first voltage, and applies one combination to the comparators. Based on this arrangement, it is possible to change over between the combination of the reference voltage and the input analog signal and the combination of the first voltage and the second voltage, while restricting an influence on the precision due to the provision of the switches. As a result, there is an effect that it is possible to improve the precision while reducing power consumption.

Further, according to the present invention, a high-potential side voltage of the power source or a low-potential side voltage of the power source is used as the first voltage, and a low-potential side voltage of the power source or a high-potential side voltage of the power source is used as the second voltage. Therefore, there is an effect that it is possible to obtain the first voltage and the second voltage easily and securely for preventing the through current of the inverter circuits within the comparators.

Further, according to the present invention, the switches is disposed at a pre-stage of the safety unit for stabilizing the input analog signal and the reference voltage. Therefore, it is possible to further restrict an influence on the precision due to the provision of the switches. As a result, there is an effect that it is possible to further improve the precision.

Further, according to the present invention, the first switch selects one of the high-potential side voltage of the power source (or the low-potential side voltage of the power source) and the high-level reference voltage, and applies the selected voltage to the first buffer circuit. The second switch selects one of the high-potential side voltage of the power source (or the low-potential side voltage of the power source) and the low-level reference voltage, and applies the selected voltage to the second buffer circuit. The third switch selects one of the low-potential side voltage of the power source (or the high-potential side voltage of the power source) and the input analog signal, and applies the selected voltage or signal to the third buffer circuit. The series-connected resistor circuit divides a voltage range from the output voltage of the first buffer circuit to the output voltage of the second buffer circuit into a plurality of stages, and outputs the divided voltages to the comparators. Each comparator inputs the output voltage of the third buffer circuit and the output voltage of the series-connected resistor circuit and compares between these voltages. Based on the above arrangement, it is possible to switch over between the reference voltage and the input analog signal and the high-potential side voltage of the power source and the low-potential side voltage of the power source (or the low-potential side voltage of the power source and the high-potential side voltage of the power source), while restricting an influence on the precision due to the provision of the first switch, the second switch and the third switch. As a result, there is an effect that it is possible to improve the precision while reducing power consumption.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. An analog-to-digital (A/D) converter circuit having:

N (where N is a natural number above 2) comparators, each comparator receiving an input analog signal and a respective reference voltage, comparing the input analog signal to the respective reference voltage, and generating a digital signal based on comparing the input analog signal to the reference voltage;

a series-connected resistor circuit having N+1 resistors connected in series, the series-connected resistor circuit having first and second terminals, wherein a node between a directly connected pair of resistors is connected to a terminal of the respective comparator that receives the reference voltage;

a first buffer circuit having an output terminal to which the first of the terminals of the series-connected resistor circuit is connected;

a second buffer circuit having an output terminal to which the second of the terminals of the series-connected resistor circuit is connected;

a third buffer circuit having an output terminal to which terminals of the comparators that receive the input analog signal are connected;

a first switch for selecting between a first voltage of a power source, and a first reference voltage for generating each reference voltage, and connecting the voltage selected to an input terminal of the first buffer circuit;

a second switch for selecting between the first voltage of the power source, and a second reference voltage for generating each reference voltage, and connecting the voltage selected to an input terminal of the second buffer circuit; and a third switch for selecting between a second voltage of the power source, and the input analog signal, and connecting the voltage or input analog signal selected to an input terminal of the third buffer circuit.

2. The A/D converter circuit according to claim 1, wherein the first voltage of the power source is a high-potential side voltage of the power source and the second voltage of the power source is a low-potential side voltage of the power source.

3. The A/D converter circuit according to claim 1, wherein the first voltage of the power source is a low-potential side voltage of the power source and the second voltage of the power source is a high-potential side voltage of the power source.

4. An analog-to-digital (A/D) converter circuit which converts an input analog signal into a digital signal, the A/D converter circuit comprising:

a switch unit which receives the input analog signal, a reference voltage, a first voltage, and a second voltage which is lower than the first voltage; and a comparator unit which receives the input analog signal and the reference voltage from the switch unit, compares the input analog signal to the reference voltage, and outputs a digital signal based on comparing the input analog signal to the reference voltage, wherein the switch unit outputs the input analog signal and the reference voltage to the comparator unit when the comparator is required to make an A/D conversion of the input analog signal, and outputs the first voltage and the second voltage to the comparator unit when the comparator unit is not required to perform the A/D conversion of the input analog signal.

5. The A/D converter circuit according to claim 4 further comprising a power source that generates a high-potential voltage and a low-potential voltage, wherein the high-potential voltage of the power source is supplied to the switch unit as the first voltage, and the low-potential voltage of the power source is supplied to the switch unit as the second voltage.

6. The A/D converter circuit according to claim 4 further comprising a buffer unit, disposed between the switch unit and the comparator unit, stabilizing the input analog signal and the reference voltage output by the switch unit and supplying a stabilized input analog signal and the reference voltage to the comparator unit.

* * * * *